United States Patent
Laaksonen et al.

(10) Patent No.: US 10,908,410 B2
(45) Date of Patent: Feb. 2, 2021

(54) SCANNING REFLECTOR SYSTEM

(71) Applicant: MURATA MANUFACTURING CO., LTD., Nagaokakyo (JP)

(72) Inventors: Tapani Laaksonen, Espoo (FI); Konsta Wjuga, Helsinki (FI); Mikko Pynnönen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 273 days.

(21) Appl. No.: 16/196,533

(22) Filed: Nov. 20, 2018

(65) Prior Publication Data

US 2019/0162948 A1 May 30, 2019

(30) Foreign Application Priority Data

Nov. 24, 2017 (FI) ..................................... 20176055

(51) Int. Cl.
- *G02B 26/08* (2006.01)
- *B81B 3/00* (2006.01)
- *B81B 7/02* (2006.01)

(52) U.S. Cl.
CPC ........ *G02B 26/0841* (2013.01); *B81B 3/0083* (2013.01); *B81B 7/02* (2013.01); *G02B 26/0858* (2013.01); *B81B 2201/042* (2013.01)

(58) Field of Classification Search
CPC ............ G02B 26/0841; G02B 26/0858; G02B 26/101; G02B 26/0833; B81B 3/0083; B81B 7/02; B81B 2201/042
See application file for complete search history.

(56) References Cited

U.S. PATENT DOCUMENTS

| | | | |
|---|---|---|---|
| 6,825,796 B2 * | 11/2004 | Oki | ........................ G01S 17/931 |
| | | | 342/70 |
| 2006/0198006 A1 | 9/2006 | Kato et al. | |

(Continued)

FOREIGN PATENT DOCUMENTS

| JP | 2003-004851 A | 1/2003 |
|---|---|---|
| JP | 2014145941 A | 8/2014 |
| JP | 2017167254 A | 9/2017 |

OTHER PUBLICATIONS

Ulrich Hofmann et al., "Resonant Biaxial 7-mm MEMS Mirror for Omnidirectional Scanning", Journal of Micro/Nanolithography, MEMS, and MO, Jan.-Mar. 2014/vol. 13"EMS.

(Continued)

*Primary Examiner* — Robert E. Tallman
(74) *Attorney, Agent, or Firm* — Squire Patton Boggs (US) LLP (57) ABSTRACT

An apparatus includes a reflector system having a support, a reflector and a spring structure for scanning motion of the reflector in two orthogonal oscillation modes. A frequency response peaks at a natural resonant frequency with an initial bandwidth. A first transducer structure provides mechanical actuation of the reflector; a second transducer structure generates sense signals representing mechanical motion of the reflector. A feedback circuit receives from the second transducer structure a sense signal and generates to the first transducer structure a drive signal. The feedback circuit is adjusts amplitude and frequency of the drive signal to a non-linear vibration range where a frequency shift at the peak frequency is at least ten times the initial bandwidth, varies the amplitude of the drive signal in proportion to a waveform of a modulation signal, and sets frequency of the modulation signal component smaller than the frequency shift at the peak frequency.

12 Claims, 6 Drawing Sheets

(56) References Cited

U.S. PATENT DOCUMENTS

| | | |
|---|---|---|
| 2007/0273946 A1 | 11/2007 | Kato et al. |
| 2009/0302960 A1 | 12/2009 | Schenk et al. |
| 2012/0320379 A1 | 12/2012 | Hofmann et al. |
| 2014/0159620 A1 | 6/2014 | Yamamoto et al. |

OTHER PUBLICATIONS

Finnish Search Report dated May 14, 2018 corresponding to Finnish Patent Application No. 20176055.

M. Imboden et al., "High-Speed Control of Electromechanical Transduction: Advanced Drive Techniques for Optimized Step-and-Settle Response of MEMS Micromirrors," In: IEEE Control Systems. IEEE, Sep. 15, 2016, vol. 36, No. 5, pp. 48-76.

S. Evoy et al., "Nanofabrication and electrostatic Operation of Single-Crystal Silicon Paddle Oscillators," In: Journal of Applied Physics, American Institute of Physics, Dec. 1, 1999, vol. 86, No. 11, pp. 6072-6077.

Franz-Josef Elmer, "Nonlinear Resonance," The Pendulum Lab, University of Basel, Switzerland, downloaded from http://www.elmer.unibas.ch/pendulum/nonres.htm, 1998.

\* cited by examiner

Pendulum Lab by Franz-Josef Elmer, University of Basel, Switzerland
(https://www.elmer.unibas.ch/pendulum/nonres.htm)

SCANNING REFLECTOR SYSTEM

FIELD OF THE DISCLOSURE

The present disclosure relates to scanning reflector systems, and more particularly to an apparatus and a method enabling scanning motion in two orthogonal oscillation modes.

BACKGROUND OF THE DISCLOSURE

Scanning microelectromechanical (MEMS) reflectors can be used in imaging devices such as light-detecting and ranging sensors (LIDARs). A scanning MEMS reflector may contain at least one moving reflector which can reflect light beams from a laser emitter towards the surrounding environment. Additional reflectors or lenses may be included in the light path between the moving reflector and the environment. Returning light beams can be reflected inward towards a photodetector by the same reflectors or lenses which reflected the outgoing beam.

Figure 1:
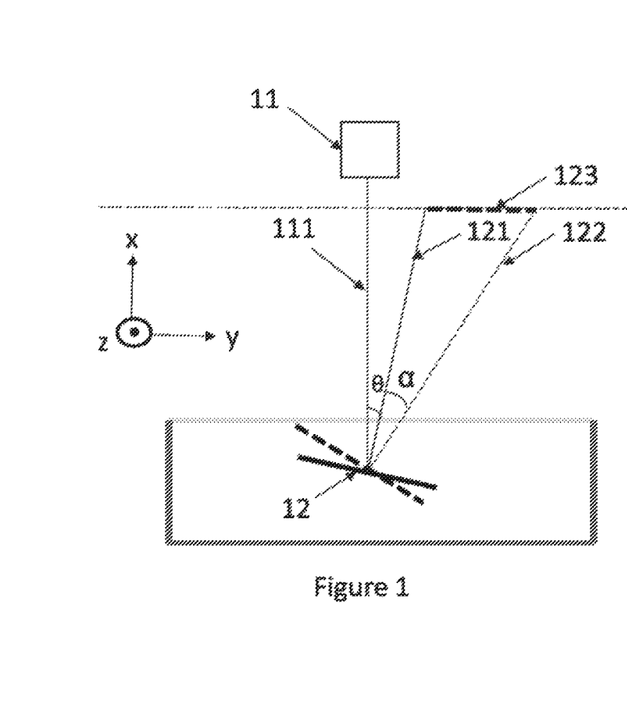
FIG. 1 shows a simplified two-dimensional sketch of a reflector system.

The imaging area (i.e. the field of view) of a scanning MEMS reflector is in part determined by how much and in which way the moving reflector can be tilted. This is illustrated in FIG. 1, which shows a simplified two-dimensional sketch of a reflector system. A laser emitter 11 emits a light beam 111. A moving reflector 12 is suspended from a torsion beam and can be rotated about the z-axis. The reflector 12 is shown with a solid line in the position where it has rotated to its counter-clockwise extremity. The light beam 121 reflected from this position is also shown with a solid line. The reflector 12 is shown with a dashed line in the position where it has rotated to its clockwise extremity. The light beam 122 reflected from this position is also shown with a dashed line. In this simplified sketch, the imaging area of the reflector in the zy-plane would be a line, the length of which is determined by the angle $\alpha$ between the two beams 121 and 122. As seen in FIG. 1, the extent of $\alpha$ is determined by the range of tilt angles $\theta$, which the reflector 12 can obtain. For a multidirectional scanning motion, a more complex movement that involves lifting and sinking of the various reflector sides in a suitably coordinated and timed order is needed.

Figure 2:
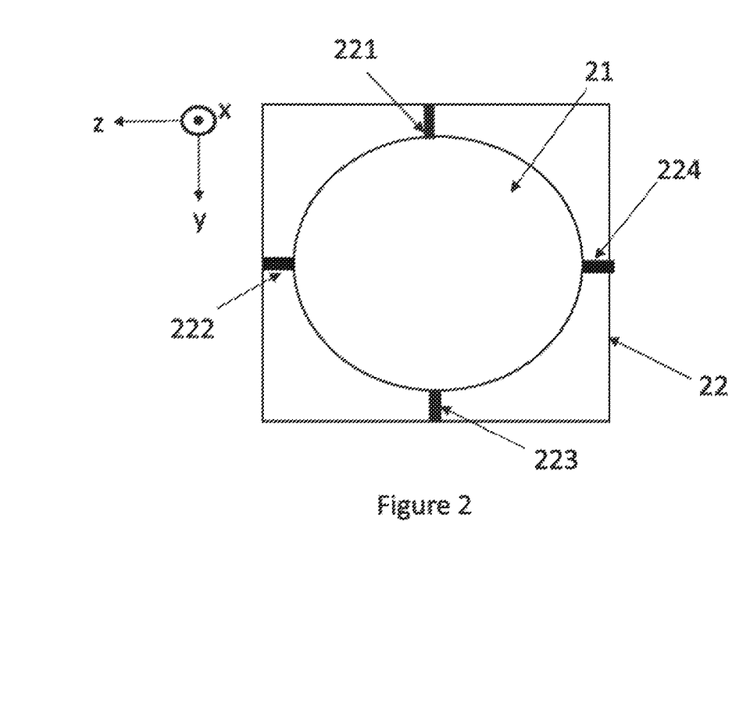
FIG. 2 illustrates scanning modes of a circular reflector.

Multidirectional scanning motion can be generated with a system, which is schematically illustrated in FIG. 2. It shows a circular reflector 21 in the yz-plane. This reflector 21 is suspended from a frame 22 by four actuators 221, 222, 223 and 224, fixed in symmetrically located positions around the edge of the reflector 21. Each actuator is controlled by a voltage and each actuator can lift the reflector edge upwards or sink it downwards at the point where the actuator is fixed to the edge.

By coordinating the lifting and sinking movements of each actuator suitably, the reflector surface can be tilted away from the yz-plane in any direction. For example, if actuator 224 lifts the edge to which it is fixed, while actuator 222 sinks the edge to which it is fixed, and both 221 and 223 keep the edges to which they are fixed in a middle position, then the reflector movement mimics tilting about the y-axis. If actuator 221 lifts while 223 sinks, and both 222 and 224 stay in a middle position, then the reflector movement mimics tilting about the z-axis. If actuators 222 and 221 lift while 223 and 224 sink, the reflector movement mimics a combined tilt about both the y- and the z-axis.

For a multidirectional scanning mode, the moving reflector 12 can be arranged to oscillate about two orthogonal axes of rotation. Both oscillations can be excited and driven simultaneously, and the resulting position of the reflector is a superposition of the two oscillation modes. The reflector is thereby made to undergo scanning motion in two orthogonal oscillation modes. Advantageously these oscillation modes are operated resonantly.

If the reflector is driven to oscillate at a resonant frequency, the maximum tilt angle can be written as $$\theta = 2QF/(\pi^2 M f_{res}^2 r).$$

where Q is energy stored in the reflector/energy loss per vibration cycle, M is the mass of the reflector, r the radius of the reflector, $f_{res}$ is the resonance frequency, and F is the driving force. The driving force F can be written as $$F = \eta V$$

where $\eta$ is the transductance factor of the actuator and V the applied voltage. Accordingly, to achieve a large tilt angle $\theta$, the system has to have a large Q-value, or a very large voltage has to be used to drive the tilting. Using a very large driving voltage is not practical, but Q-values in the order of 1000-10000, or even more, can be achieved when the reflector is vacuum packaged into a structural system element.

When the orthogonal sinusoidal oscillation modes are driven in resonance with a 90 deg phase difference, the reflected beam 121 of FIG. 1 creates a circular scan trajectory on a surface 123 in the yz-plane. With a suitable arrangement of fixed reflectors (not shown in FIG. 1), this reflected beam 121 can be further reflected or refracted such that a one-dimensional 360° scanning view, corresponding to one circle in the yz-plane, is created. For image forming, however, a scan pattern that widens the image area corresponding to the circle in the x-direction to correspond to an annular ring is needed in many applications. However, the requirement for use of high Q values creates some problems in this respect.

Notwithstanding the implementation, there is always frequency splitting of the two tilting eigenmodes, and while the Q value is high, the bandwidth of each of the resonances is very narrow. This means that in controllably driven oscillation modes, very substantial changes occur in amplitude even with small shifts in frequency. These changes can be controlled by separate feed-back loops that hold the phase and amplitude of each of the oscillation modes constant, as disclosed in document US20120320379. However, small deviations in each of the high-quality oscillation modes still have the detrimental effect to the amplitude, so outside the narrow bandwidth, applicable drive voltages do not enable introduction of a modulation signal that could vary the tilt angle $\theta$ within an angle $\alpha$ adequate for 2-dimensional image area resulting from successive 360° scanning rounds.

Furthermore, the system response to an external modulation signal has an exponential transient term proportional to $\sim\exp(-t/\tau)$, where $\tau$ is the system time constant. Since $$\tau = Q/\pi fr$$

we can write the transient term as $\sim\exp(-t/\tau) = \exp(-\pi f r t/Q) = \exp(-\pi \Delta f t)$. This means that the large Q-value (narrow bandwidth) creates problems if the mirror tilt angle needs to change rapidly, since the time constant is large and the transient term dies slowly.

BRIEF DESCRIPTION OF THE DISCLOSURE

An object of the present disclosure is to provide a method and an apparatus for implementing the method so as to overcome, or at least alleviate the above problems in forming broadened image areas with a scanning mirror system.

The objects of the disclosure are achieved by an apparatus and a method which are characterized by what is stated in the independent claims. The preferred embodiments of the disclosure are disclosed in the dependent claims.

The disclosure is based on the idea of configuring a feedback circuit to drive the reflector system in a nonlinear range that is conventionally avoided for adverse instabilities, and use a specific phenomenon in frequency response therein to enable image area broadening modulation.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 3:
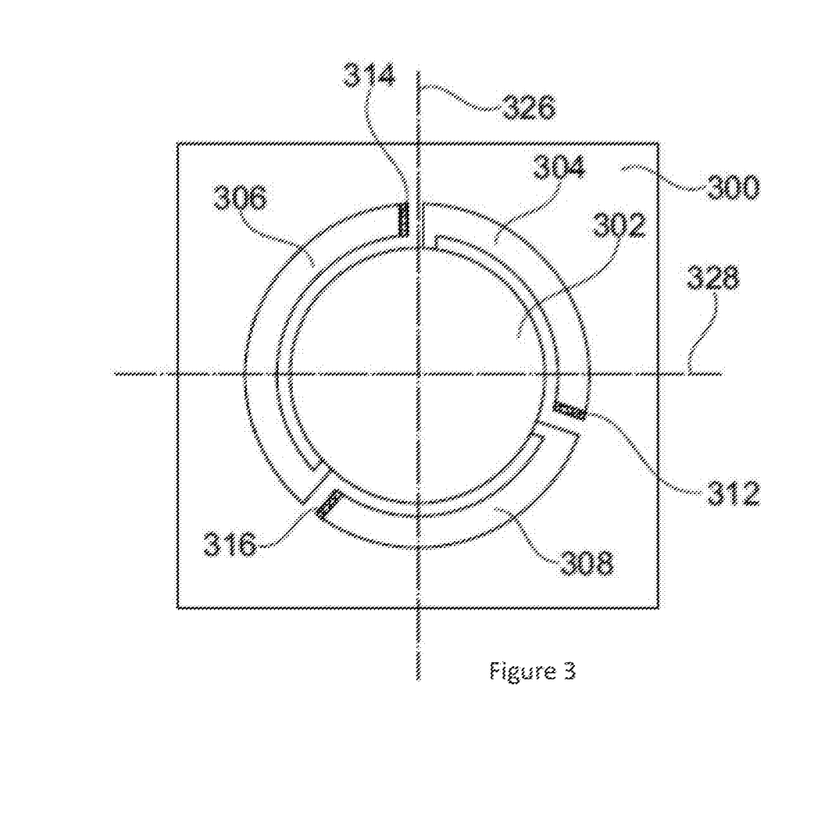
FIG. 3 illustrates elements of an exemplary reflector system.

Embodiments of this disclosure include an apparatus that includes a reflector system and a feedback circuit. FIG. 3 illustrates elements of a reflector system applicable in the disclosed apparatus. The reflector system comprises a support 300, a reflector 302 and a spring structure 304, 306, 308 suspending the reflector from the support for scanning motion of the reflector in two orthogonal oscillation modes.

The term support 300 refers herein to a mechanical element that may be part of the apparatus that includes the reflector system, for example a part of a MEMS scanning reflector device. Alternatively, the support can be a separate element rigidly fixed to the apparatus. Accordingly, the support represents here any element that provides a rigid, locally inert reference to which other elements of the reflector system can be fixed, or from which other elements of the reflector system can be suspended. The support can, but does not mandatorily include a frame that surrounds the reflector. In some embodiments of the reflector system, the support is a supporting layer underneath and separated by an out-of-plane gap from a device layer of the reflector and the suspenders. The support and the device layer may be coupled through one or more protruding fixing points 312, 314, 316.

The term reflector 302 refers herein to any element that includes a reflective surface that returns back an incident wavefront of light. The law of reflection states that for each incident ray, the angle of incidence equals the angle of reflection, and the incident, normal and reflected directions are coplanar. In microelectromechanical reflector systems, a reflective surface of the reflector may be implemented, for example, by means of a silicon plate coated with a reflective coating. The reflective coating may include, for example, one or more metal thin film layers, such as aluminium, silver, gold or copper films. Alternatively, the coating may comprise a stack of one or more dielectric films with different refractive indexes, where the films are arranged so that the stack reflects light. Advantageously, the reflective surface is planar.

The spring structure comprises one or more suspenders 304, 306, 308. Position or orientation of a rigid element suspended from another rigid element has at least one degree of freedom. The term suspender 304, 306, 308 thus refers herein to a mechanical part that suspends the reflector 302 to the support 300 and provides at least one degree of freedom between the support and the reflector. In other words, when the reflector is attached to the support with suspenders, parts of the suspenders and the reflector carried by the suspenders can move in relation to the support. A suspender supports the weight of the reflector, but it also moves or allows movement of the reflector in relation to the support during actuation. The suspenders can be, for example, silicon beams formed from the same silicon substrate layer as the reflector plate.

The reflector system includes a first transducer structure for mechanical actuation of the reflector according to a drive signal. The exemplary embodiment of FIG. 3 shows an arrangement where the suspenders suspending the reflector from the support include piezoelectric actuators. The term actuator refers here to a piezoelectric component which undergoes physical deformation in response to a voltage applied to the component. An actuator can be used to drive oscillating movement when it is controlled with a periodic AC voltage signal. A bending piezoelectric actuator for a scanning MEMS reflector may include a silicon layer coated with piezoelectric layers and conductive layers which transmit the voltage signal to the piezoelectric layers. An approximately 50 μm thick layer of silicon is sufficiently thin to bend with the piezoelectric material when a voltage is applied. The bending piezoelectric actuators include a piezoelectrically active layer, such as aluminium nitride, to facilitate actuation movement. The bending piezoelectric actuator may also include metal electrode layers on two sides of the piezoelectrically active layer so that the actuation movement can be controlled by voltage signals. The electrodes may, for example, be prepared from molybdenum, aluminium or titanium.

In the microelectromechanical reflector system of FIG. 3, each suspender 304, 306, 308 is fixed from a respective fixing point 312, 314, 316 to the support. It is noted that the suspender configuration of FIG. 3 is exemplary, the amount, form and positions of suspenders and fixing points can be varied within the scope. Fixing refers herein to a mechanically rigid connection where an end of a suspender is securely placed or fastened to a fixing point. The fixing points 312, 314, 316 may provide also a route for leads of electrical connection to the suspenders.

If the reflecting surface of the reflector in non-actuated state is considered to align to a virtual reference plane, the resilient suspenders and the piezoelectric actuators on the suspenders enable second ends of the suspenders to displace in out-of-plane direction. These displacements may be applied to induce the reflector into motion that can be expressed as oscillation about two axes of rotation. In FIG. 3, a first axis of rotation 326 is shown in alignment to the Y direction, and the second axis of rotation 328 is shown in alignment to the X direction, both in the virtual plane of reference that aligns with the page of the drawing.

The oscillation of the reflector 302 can be driven by applying a periodic AC voltage to one or more of the elongate piezoelectric actuators extending on the elongate suspenders 304, 306, 308. For this, the microelectromechanical reflector system typically includes a control device that is electrically connected to the piezoelectric actuators of the suspenders and configured to provide actuation voltages operating the actuators in a manner controlled by design. The control device may be a feedback circuit to be disclosed in more detail with FIG. 5.

A first mode of oscillation refers here to oscillation of the reflector 302 about the first axis of rotation 326 (Y mode oscillation). A second mode of oscillation refers here to oscillation of the reflector about the second axis of rotation 328 (X mode oscillation). The scanning motion for circular scan trajectory can be brought about by applying a periodic actuation signal successively to the suspenders. When actuated, fixed first ends of the suspenders remain fixed to their respective fixing points, but the second ends of the suspenders displace simultaneously in the out-of-plane direction. Through controlled actuation, one side of the reflector is driven to move up when the opposite side of the reflector moves down, and vice versa.

A general objective of reflector systems is to ensure that the power consumption required for achieving the oscillation is optimized. The greatest amplitude response is achieved by designing the reflector system to operate in resonance mode, i.e. so that oscillation in both oscillation modes occur in their respective mechanical resonance frequencies. The control device is thus configured to provide control signals to simultaneously drive the reflector 302 to a first rotary oscillation about the first axis of rotation 326 in a first resonance frequency F1, and to a second rotary oscillation about a second axis of rotation 328 in a second resonance frequency F2. The first axis of rotation 326 and the second axis of rotation are orthogonal, so the resulting position of the reflector 302 is a superposition of the first rotary oscillation and the second rotary oscillation. When F1 is equal to F2, a scanning motion for circular scan trajectory, also called as wobbling mode scanning motion, is achieved.

When a beam of light incident on the reflective surface of the reflector 302 is reflected back, the direction of the reflected beam depends on the position of the reflector at the time of the incidence. Advantageously the first rotary oscillation and the second rotary oscillation are arranged to position the reflector such that the reflected beam moves along a controlled scan pattern, which forms image area of the reflector system.

Figure 4:
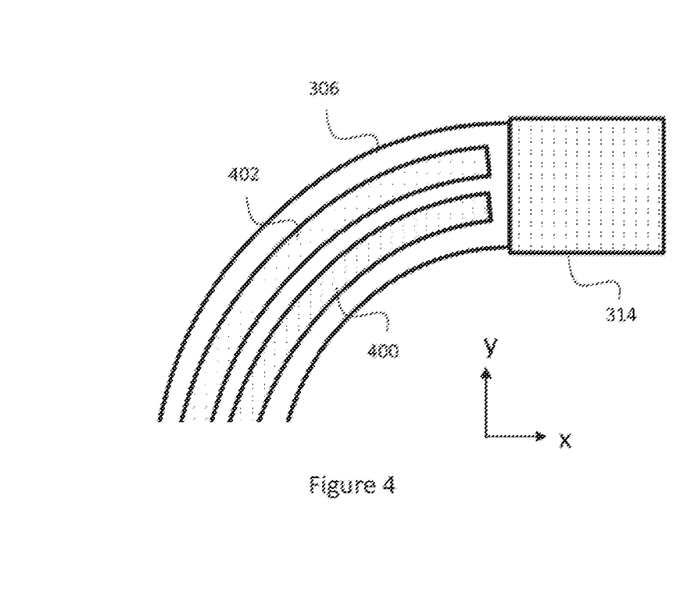
FIG. 4 illustrates an exemplary transducer arrangement.

For controlled oscillation of the reflector, the reflector system includes at least one second transducer configured to generate a sense signal representing mechanical motion of the reflector. One possible method to achieve this is to sense realized displacements of the suspenders. For this, one or more, advantageously all of the suspenders can be provided with piezoelectric detector elements, in addition to the piezoelectric actuators. The term detector refers here to a piezoelectric component that generates a voltage signal in response to a physical deformation induced to it by the oscillatory motion of the reflector. FIG. 4 illustrates an exemplary arrangement in which an elongate piezoelectric actuator 400 and a piezoelectric detector element 402 extend electrically separately but mechanically coupled side by side on a suspender 306 of FIG. 3. The electrical connection to the control element for actuation and detection voltages to the piezoelectric elements can be led through the fixing point 314. Other transducer configurations may naturally be applied within the scope. For example, piezoelectric transducers are advantageous for oscillating reflector system applications due to their compact size and low drive voltage requirement. However, capacitive actuation and sensing can be applied within the scope, as well. Implementation of capacitive sensing and detection is well known to a skilled person and will not be described herein in more detail.

Figure 5:
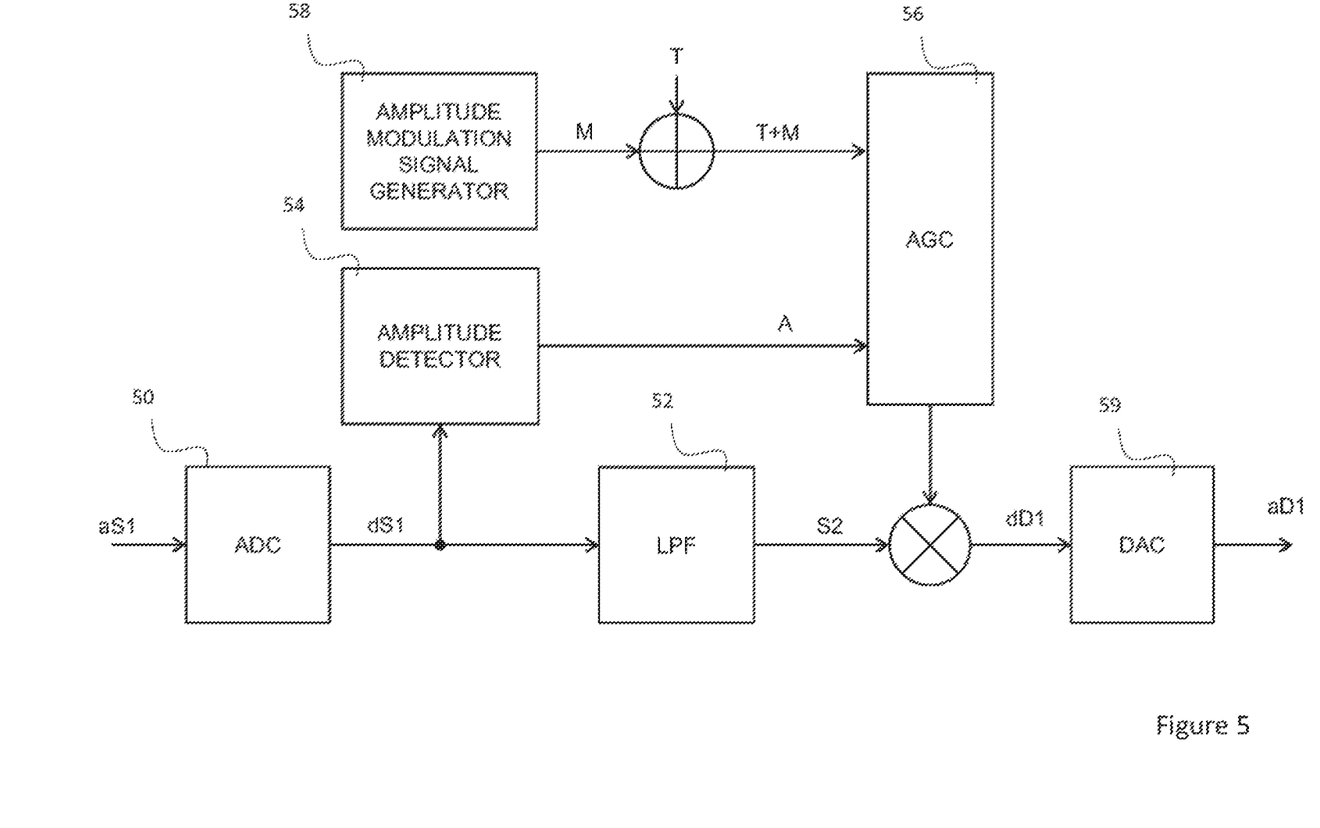
FIG. 5 illustrates basic functional elements of an exemplary feedback circuit.

FIG. 5 illustrates basic functional elements of an exemplary feedback circuit applicable in the disclosed apparatus. The feedback circuit is configured to receive from at least one transducer of the second transducer structure a sense signal and generate to a transducer of the first transducer structure a drive signal based on the received sense signal. FIG. 5 shows an exemplary digital closed loop drive circuitry for one channel of a reflector system element, without limiting the scope to digital implementations only. For a person skilled in the art it is clear that the disclosed functions may be implemented with various combinations of analog and digital signal control element configurations. One channel in this context refers to parts of the feedback circuitry applied in feedback operation of one pair of a first transducer structure actuating the reflector and a second transducer structure sensing motions of the reflector in or from the same reflector location. In this particular example, each pair of transducers can be positioned, for example, on one suspender, one end of which is coupled to an edge point of the reflector, and the other end to the support. A transducer of the first transducer structure (actuator) and a transducer of the second transducer structure (detector) positioned on a same suspender then form one channel for the feedback circuit.

In operation, a suspender bends with out-of-plane motion of the coupled reflector, and a transducer element of the second transducer structure on it generates an analog signal that a conventional analog front-end circuitry (not shown) processes into a sense signal aS1. The analog sense signal aS1 is digitized with an analog-to-digital converter (ADC) 50, and the digitized signal dS1 is fed into a digital Low Pass Filter (LPF) 52, which is tuned to shift the phase of the digitized dS1 signal approximately by 90 degrees at the resonance frequency. An amplitude detector 54 measures the amplitude A of the digitized signal dS1 and feeds it to an Automatic Gain Controller (AGC) 56. AGC compares the sensed signal amplitude A to a configurable reference level and automatically adjusts multiplication factor of the phase shifted channel signal S2 from the LPF output to a correct level. If the sensed signal amplitude A is too small, the gain is increased, and vice versa. The configurable reference level in FIG. 5 is illustrated with a predefined target amplitude T. With a constant target amplitude T, a sinusoidal drive signal enabling the circular scanning trajectory with a constant tilt angle is achieved.

Figure 6:
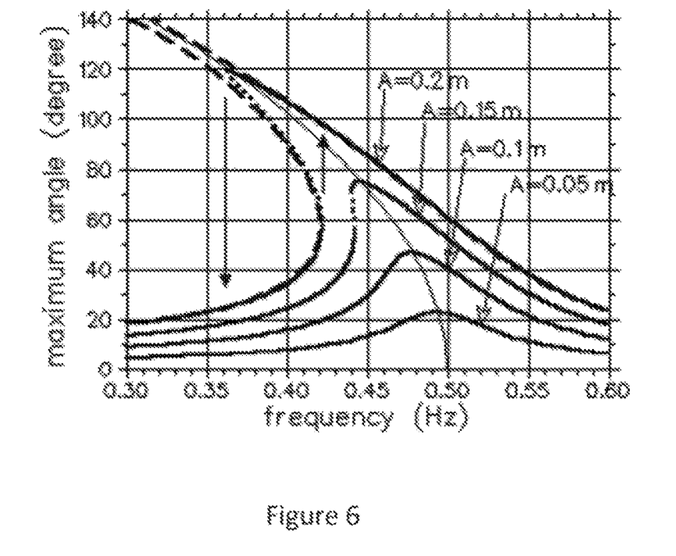
FIG. 6 illustrates foldover effect with an amplitude versus frequency plot.

In the present invention, in order to achieve larger image area, the reflector system is driven in a non-linear vibration range where a frequency shift at the peak frequency is at least ten times the initial bandwidth. In other words, amplitude and frequency of the drive signal are adjusted to a non-linear vibration range where a frequency shift at the peak frequency is at least ten times the initial bandwidth. As outlined earlier, each oscillation mode of the reflector has a resonance response that peaks at a natural resonant frequency with an initial bandwidth. In order to enable larger tilt angles with applicable drive voltages, the initial bandwidth typically corresponds to a quality factor (Q value) of 1000 or more, in many practical applications even to a quality factor of 10000 or more. For example, MEMS mirrors in a laser range sensor developed within the scope of the European-funded project MiniFaros already apply Q values of 10,000, and further improvements in the vacuum packaging procedure are expected to enable increase in the Q factor (Hofmann et al.: "Resonant biaxial 7-mm MEMS mirror for omnidirectional scanning", Journal of Micro/Nanolitography, MEMS, and MOEMS, January-March 2014/Vol. 13), In harmonic oscillators, the restoring force is proportional in magnitude and opposite in direction to the displacement of x from its natural position $x_0$. As a result of nonlinearity, the vibration frequency can change, depending upon the system's displacement. These changes in the vibration frequency result in energy being coupled from the fundamental vibration frequency to other frequencies through a process known as parametric coupling. With increased drive amplitude, the resonance frequency is shifted from its natural value by a factor $\kappa A^2$, where $\kappa$ is a constant defined by anharmonic coefficients and A is the oscillation amplitude. At low bias voltages, the mechanical spring constant dominates and at the high drive levels the resonant peak shifts to a higher or lower frequency. At the same time, the shape of the resonance curve is distorted. The distortion effect is called the foldover effect, and FIG. 6 illustrates it with an amplitude versus frequency plot of a sinusoidally driven pendulum (Pendulum Lab by Franz-Josef Elmer, University of Basel, Switzerland, https://www.elmer.unibas.ch/pendulum/nonres.htm). It may be seen that as long as the driving amplitude A is small, the resonance line is very well approximated by the result for an underdamped harmonic oscillator. For stronger driving, the resonance lines "folds", eventually leading to bistability and hysteresis. That is, the nonlinear oscillator oscillates either with a large amplitude or a small amplitude. In between there is an unstable periodic solution (shown as a dotted line). At the ends of the interval of bistablity this unstable limit cycle annihilates with one of its stable counterpart in a saddle-node bifurcation.

Conventionally, for microelectromechanical system (MEMS) applications using mechanical oscillators, non-linearity has been considered a drawback, because it causes large displacement instabilities and excessive frequency noise, and thus degrades their performance. However, it has now been detected that the reflector system can be made to operate as a Duffing oscillator, in which the typically undesired distortion related to nonlinear resonances can be utilised to enable modulation of the drive amplitude for a range of MEMS scanning mirror implementations with normally applicable drive voltages and time constants. In order to achieve this, the feedback circuit needs to be configured to drive the reflector in a non-linear vibration range where a frequency shift at the peak frequency is at least ten times the initial bandwidth.

Figure 7A:
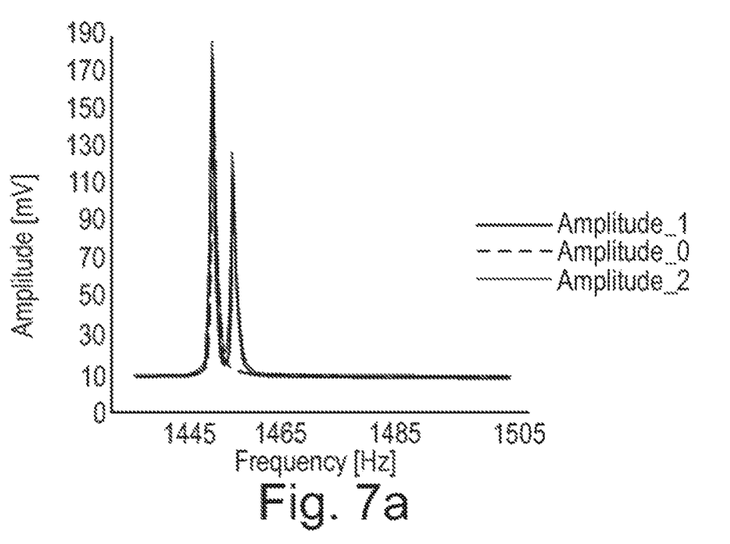
FIGS. 7a to 7c illustrate change in shape of frequency response when drive amplitude is taken to a non-linear vibration range.
Figure 7B:
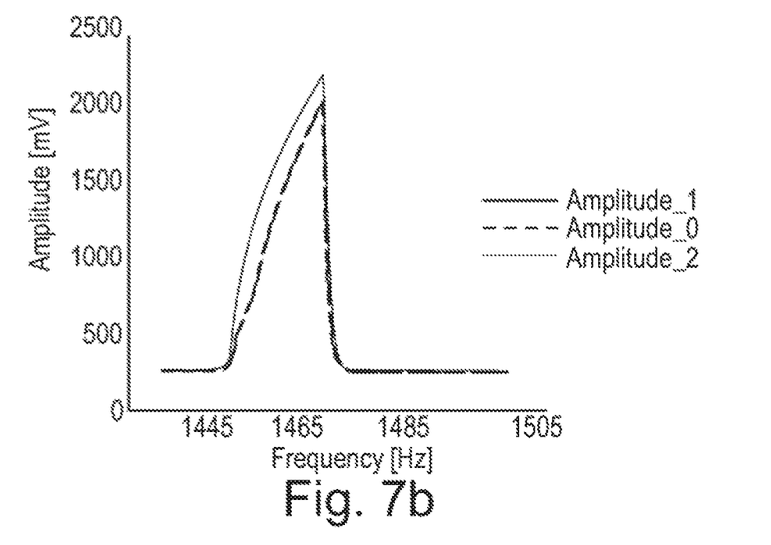
Figure 7C:
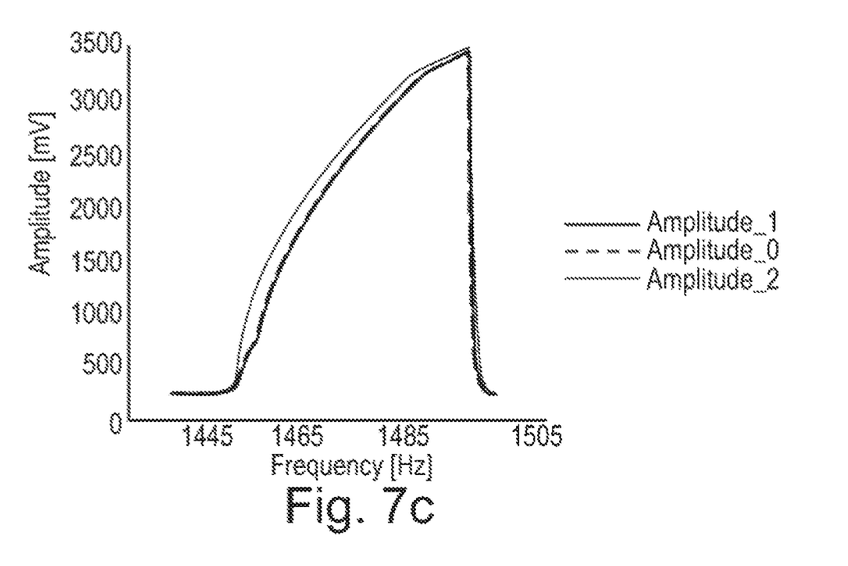

FIGS. 7a to 7c illustrate the change in shape of measured frequency responses in three channels of the exemplary reflector system structure of FIG. 3 when drive amplitudes are taken from a linear to a non-linear vibration range. The frequency range in all FIGS. 7a to 7c is 1440-1500 HZ, and the drive voltage is increased from 30 mV of FIGS. 7a to 150 mV of FIG. 7b, and from there to 300 mV of FIG. 7c. It is noted that the graphs are illustrative only, so different channels are not clearly identifiable and the shown amplitude values are not directly comparable. However, FIG. 7a illustrates linear operation region showing sharply peaked, partially non-overlapping frequency responses of the three channels. The initial bandwidth Δf of these peaks (Full Width at Half Max=FWHM) is of the order of 1 Hz. FIG. 7b illustrates the effect from quintupling the initial drive voltage applied in the linear region. It is seen that the bandwidth Δf of the resonance response curves corresponds to a frequency shift at the peak frequency, and has increased to the order of 11 Hz. FIG. 7c illustrates further the order of 34 Hz increase in the bandwidth Δf of the resonance response curves when the initial drive voltage is decupled. In view of FIGS. 7b and 7c, both of shown driving schemes are in the detected operational range and would thus be applicable to enable modulation of the drive amplitude. It has been detected that in the claimed range, the Q value can be made to remain high enough to enable desired tilt angles of the reflector, but low enough for the transient term in the reflector system to enable specifically controlled modulation.

In this particular setup, the desired modulation may be implemented simply by varying the amplitude of the drive signal in proportion to a waveform of a modulation signal. In the exemplary implementation of FIG. 5, the channel signal S2 would conventionally be controlled to a predefined target amplitude level T. For the desired modulation, the feedback circuit includes an amplitude modulation signal generator 58 that creates a sinusoidal modulation signal M with much lower frequency than the frequency of the channel signal S2. The modulation signal M is in this example summed to the predefined target amplitude T so that AGC compares the sensed signal amplitude A to the summed target T+M and continuously adjusts multiplication factor of the channel signal S2 from the LPF output to a corresponding modulated level. The multiplied signal dD1 is then converted to an analog signal aD1 with a digital-to-analog converter (DAC) 59. Analog output circuitry (not shown) feeds the modulated analog signal to the first transducer (actuator) of the channel in question.

Figure 8:
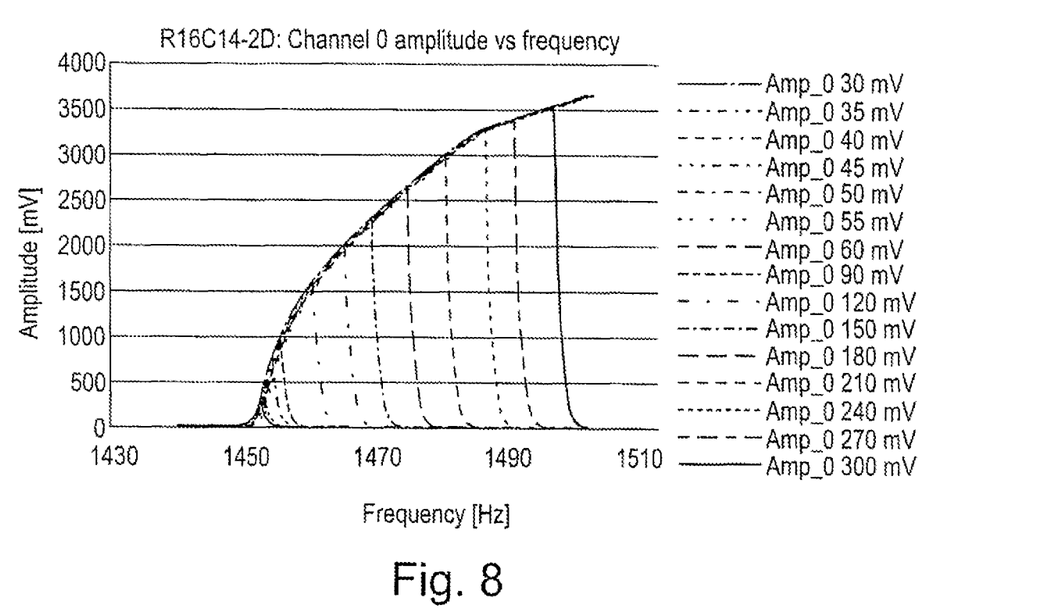
FIG. 8 illustrates change in peak frequency of one channel as the drive amplitude is increased.

It has been detected, however, that a defined balance needs to be maintained between the static and varying elements of the control parameters. FIG. 8 shows measurement results that illustrate how the peak frequency in one channel is pulled towards higher frequencies as the driving amplitude is increased. When sweeping the driving frequency upwards in the non-linear region, each resonant curve will follow the upper branch of the response curve up to the peak frequency, where it jumps down. Accordingly, for valid operational modes, the frequency of the second signal needs be set smaller than the frequency shift at the peak frequency. In other words, the frequency variation by the modulation signal needs to be in the order of the bandwidth broadened due to the nonlinear operational region. This sets a narrow operational framework, but is applicable for dimensions and functional requirements of microelectromechanical (MEMS) reflector systems, and thereby opens an important possibility for a variety of scanning MEMS mirror applications.

Figure 9:
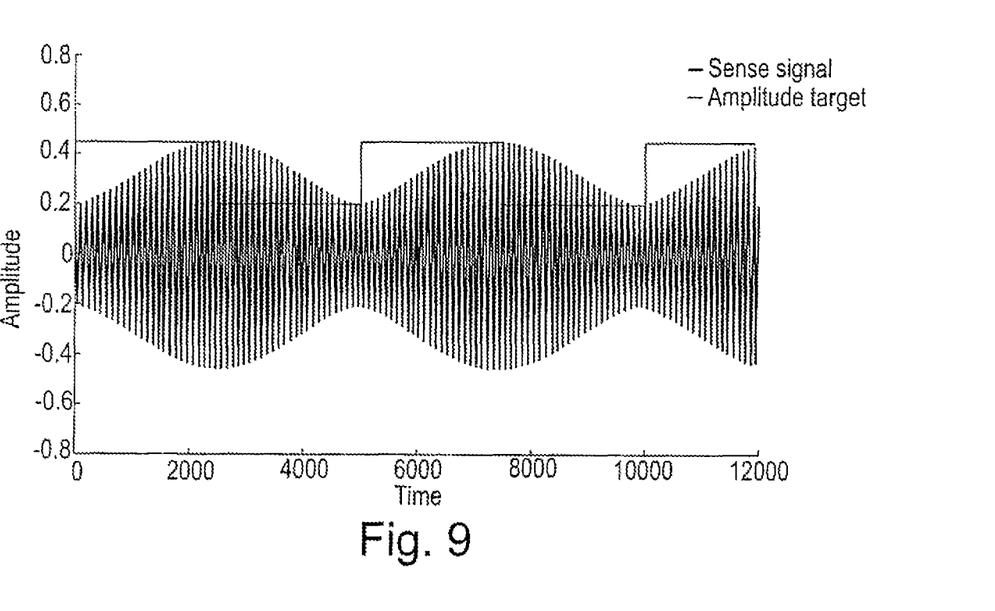
FIG. 9 illustrates in concept level the form of an amplitude modulated drive signal.

FIG. 9 illustrates in concept level the form of the amplitude modulated drive signal created as a result of the proposed reflector system and feedback circuit configuration. The drive signal and the modulation signal are advantageously sinusoidal signals. The frequency of the drive signal is advantageously at least ten times the frequency of the modulation signal. Signals measured from actual implementations have verified these results.

The signal processing stages disclosed herein can be implemented with a data processing apparatus configured to perform systematic execution of operations on received and/or stored data according to predefined, essentially programmed processes. While various aspects of the invention may be illustrated, and described as block diagrams, message flow diagrams, flow charts and logic flow diagrams, or using some other pictorial representation, it is well understood that the illustrated units, blocks, apparatus, system elements, procedures and methods may be implemented in, for example, hardware, software, firmware, special purpose circuits or logic, a computing device or some combination thereof. Software routines, or software modules which may also be called as program products, are articles of manufacture and can be stored in any apparatus-readable data storage medium, and they may include program instructions to perform predefined tasks. Accordingly, embodiments of this disclosure also include a computer program product, readable by a computer and encoding instructions that cause the disclosed apparatus to execute the disclosed steps as described herein. Embodiments of this disclosure also include a computer readable medium having stored thereon such computer program product.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. An apparatus including a reflector system and a feedback circuit, wherein
the reflector system comprises a support, a reflector and a spring structure suspending the reflector from the support for scanning motion of the reflector in two orthogonal oscillation modes;
each oscillation mode has a frequency response that peaks at a natural resonant frequency with an initial bandwidth;
the reflector system includes a first transducer structure for mechanical actuation of the reflector, and a second transducer structure for generating one or more sense signals representing mechanical motion of the reflector;
the feedback circuit is configured to receive from a transducer of the second transducer structure a sense signal and generate to a transducer of the first transducer structure a drive signal based on the received sense signal, wherein for each of the two oscillation modes, the feedback circuit is configured to
adjust amplitude and frequency of the drive signal to a non-linear vibration range where a frequency shift at the peak frequency is at least ten times the initial bandwidth;
vary the amplitude of the drive signal in proportion to a waveform of a modulation signal.

2. The apparatus of claim 1, wherein the feedback circuit is configured to set frequency of the modulation signal smaller than the frequency shift at the peak frequency.

3. The apparatus of claim 1, wherein the transducer of the first transducer structure actuates the reflector in one position and the transducer of the second transducer structure senses motion of the reflector in the same reflector position.

4. The apparatus of claim 1, wherein the spring structure suspending the reflector from the support includes one or more suspenders, one end of each suspender coupled to an edge point of the reflector, and the other end of the suspender coupled to the support.

5. The apparatus of claim 4, wherein the transducer of the first transducer structure and the transducer of the second transducer structure are positioned on a same suspender.

6. The apparatus of claim 5, wherein
the spring structure suspending the reflector from the support includes three or more suspenders;
a transducer of the first transducer structure and a transducer of the second transducer structure positioned on a same suspender form one feedback channel for the feedback circuit.

7. The apparatus of claim 1, wherein the transducer of the first transducer structure and the transducer of the second transducer structure are piezoelectric transducers.

8. The apparatus of claim 1, wherein the frequency of the drive signal is at least ten times the frequency of the modulation signal.

9. The apparatus of claim 1, wherein the drive signal and the modulation signal are sinusoidal signals.

10. The apparatus of claim 1, wherein
the feedback circuit includes an automatic gain controller element and an amplitude modulation signal generator element;
the automatic gain controller element is configured to adjust gain of the drive signal to a target level;
the target level of the automatic gain controller includes a fixed part and a varying part, the varying part varying in proportion to the waveform of the modulation signal.

11. A method for driving a reflector system that comprises a support, a reflector, a first transducer structure for mechanical actuation of the reflector, a second transducer structure for generating one or more sense signals representing mechanical motion of the reflector, and a spring structure suspending the reflector from the support for scanning motion of the reflector in two orthogonal oscillation modes, wherein each oscillation mode has a frequency response that peaks at a natural resonant frequency with an initial bandwidth; the method including
receiving from a transducer of the second transducer structure a sense signal and generating to a transducer of the first transducer structure a drive signal based on the received sense signal,
adjusting amplitude and frequency of the drive signal to a non-linear vibration range where a frequency shift at the peak frequency is at least ten times the initial bandwidth;
varying the amplitude of the drive signal in proportion to a waveform of a modulation signal;
setting frequency of the modulation signal smaller than the frequency shift at the peak frequency.

12. A computer program product embodied on a non-transitory computer readable medium, said product comprising instructions that, when executed on a processor, cause the processor to execute the method of claim 11.

* * * * *